(12) United States Patent
Horie et al.

(10) Patent No.: US 6,488,774 B1
(45) Date of Patent: Dec. 3, 2002

(54) TRAP APPARATUS

(75) Inventors: Kuniaki Horie, Tokyo (JP); Masahito Abe, Tokyo (JP); Tsutomu Nakada, Tokyo (JP); Yuji Araki, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/512,333

(22) Filed: Feb. 24, 2000

(30) Foreign Application Priority Data

Feb. 26, 1999 (JP) .......................................... 11-050610

(51) Int. Cl.[7] ........................ C23C 16/00; B01D 47/00; B01D 47/02; B01D 47/06
(52) U.S. Cl. ..................... 118/715; 261/76; 261/108; 261/111; 261/117; 261/127; 261/146; 261/147
(58) Field of Search ...................... 261/76, 78.1, 108, 261/111, 117, 127, 146, 147; 118/715

(56) References Cited

U.S. PATENT DOCUMENTS

| | | | | |
|---|---|---|---|---|
| 4,039,307 A | * | 8/1977 | Bondor | 55/228 |
| 4,312,646 A | * | 1/1982 | Fattinger et al. | 55/218 |
| 4,729,775 A | * | 3/1988 | Patte et al. | 55/241 |
| 4,865,817 A | * | 9/1989 | Burgess et al. | 422/168 |
| 4,963,329 A | * | 10/1990 | Burgess et al. | 422/168 |
| 5,011,520 A | * | 4/1991 | Carr et al. | 55/228 |
| 5,114,683 A | * | 5/1992 | Hirase | 422/173 |
| 5,512,072 A | * | 4/1996 | Laslo | 55/250 |
| 5,653,806 A | | 8/1997 | Van Buskirk | 118/715 |
| 5,704,214 A | | 1/1998 | Fujikawa et al. | 62/55.5 |
| 5,851,293 A | * | 12/1998 | Lane et al. | 118/715 |
| 5,950,925 A | | 9/1999 | Fukunaga et al. | 239/132.2 |
| 6,036,756 A | * | 3/2000 | Gohara et al. | 96/297 |
| 6,068,686 A | * | 5/2000 | Sorensen et al. | 96/135 |
| 6,090,208 A | * | 7/2000 | Han | 118/715 |
| 6,106,792 A | * | 8/2000 | Griggs et al. | 423/245.2 |

FOREIGN PATENT DOCUMENTS

| | | |
|---|---|---|
| DE | 35 17 533 A1 | 11/1985 |
| EP | 0 847 790 A1 | 6/1998 |
| GB | 2 317 901 A | 4/1998 |

\* cited by examiner

*Primary Examiner*—Jeffrie R. Lund
(74) *Attorney, Agent, or Firm*—Wenderoth, Lind & Ponack, L.L.P.

(57) ABSTRACT

A trap apparatus is optimum for trapping a material gas discharged from a vapor deposition apparatus for depositing in a vapor phase thin films of high-dielectric or ferroelectric such as barium/strontium titanates on substrates. The trap apparatus is disposed downstream of a vacuum process chamber. The vacuum process chamber is for processing a substrate. The trap apparatus is for trapping a component having a low vapor pressure contained in a gas discharged from the vacuum process chamber. The trap apparatus includes a trap container for introducing the gas discharged from the vacuum process chamber, and a cooling device provided in the trap container for cooling the gas to a temperature equal to or lower than a condensing temperature of a gas component which is contained in the gas and easily liquidized.

8 Claims, 5 Drawing Sheets

TRAP APPARATUS

BACKGROUND OF THE INVENTION

1. Field of the Invention

The present invention relates to a trap apparatus, and more particularly to a trap apparatus optimum for trapping a material gas discharged from a vapor deposition apparatus for depositing in a vapor phase thin films of high-dielectric or ferroelectric such as barium/strontium titanates on substrates.

2. Description of the Related Art

Recently, in the semiconductor manufacturing industry, the integration of integrated circuits has been improved remarkably, and the research and development activities of DRAM are being intensively carried out in anticipation of gigabit order DRAMs which will replace current megabit order DRAMs. The capacitor element having a large capacity per unit area is needed to produce such DRAMs. As a dielectric thin-film material for producing elements having such a large capacity per unit area, in place of silicon oxide or silicon nitride having dielectric constant less than 10, a metallic oxide film material such as tantalum pentaoxide ($Ta_2O_5$) having dieelectric constant of approximately 20, or barium titanate ($BaTiO_3$) or strontium titanate ($SrTiO_3$) or barium strontium titanate having dielectric constant of approximately 300 is considered to be a promising thin-film material. Further, a ferroelectric material having a higher dielectric constant is also considered to be a promising thin-film material.

In addition to the above, as a wiring material, copper which has a value of resistance lower than aluminum and a superior resistance against electromigration is considered to be a promising material. As a material for gate insulating film, BiVO, $Bi_4Ti_4O_{12}$, $YMnO_3$, ZnO, ZnS, and CdS are considered to be a promising material. As an electrode material having a perofskite structure, $SrRuO_3$, $BaRuO_3$, IrO, and $CaRuO_3$ are considered to be a promising material. As a material for a barrier layer or a buffer layer, MgO, $Y_2O_3$, YSZ, and TaN are considered to be a promising material. As a superconductivity material, La—Ba—Cu—O, La—Sr—Cu—O, Y—Ba—Cu—O, Bi—Sr—Ca—Cu—O, Tl—Ba—Ca—Cu—O, and Hg—Ba—Ca—Cu—O are considered to be a promising material.

As a process for depositing thin films of such material, a chemical vapor deposition (CVD) process is expected to have a good prospect.

FIG. 6 shows a chemical vapor deposition apparatus for depositing thin films of high-dielectric or ferroelectric such as barium/strontium titanates. The vapor deposition apparatus comprises a vaporizer 10 for vaporizing a liquid material, a hermetically sealable reaction chamber 14 disposed downstream of the vaporizer 10 and connected to the vaporizer 10 through a material gas passage 12, and a vacuum pump 18 disposed downstream of the reaction chamber 14 and provided in an evacuation passage 16. An oxidizer gas pipe 20 for supplying an oxidizer gas such as oxygen is connected to the reaction chamber 14.

In the vapor deposition apparatus having the above structure, a substrate W is placed on a stage 22 for holding and heating the substrate W, and a mixture of material gas and oxidizer gas is ejected over the substrate W from nozzles 26 of a gas supply head 24 while keeping the substrate W at a predetermined temperature, thereby depositing a thin film on a surface of the substrate W. In this case, it is necessary to supply the material gas stably to the substrate W in the reaction chamber 14. The material gas is produced by liquidizing $Ba(DPM)_2$, $Sr(DPM)_2$ or the like which is solid at room temperature, mixing the liquidized substance with organic solvent such as tetrahydrofuran (THF), and vaporizing the obtained mixture by the vaporizer 10.

Gases discharged from the reaction chamber 14 contain unconsumed material and reaction by-product having a high sublimation temperature, and hence the unconsumed material and the reaction by-product are solidified during pressure rise and deposited on the interior of the vacuum pump 18, resulting in a malfunction of the vacuum pump 18. In order to prevent this deposition on the interior of the vacuum pump, as shown in FIG. 6, a trap apparatus 30 is provided at the upstream side of the vacuum pump 18 in the evacuation passage 16 to remove components, in the discharged gases, having a high sublimation temperature and a low vapor pressure. The pipe interconnecting the reaction chamber 14 and the trap apparatus 30 is provided with a temperature adjusting device 28 comprising a mantle heater or the like in the same manner as the material gas supply passage 12.

Conventionally, as shown in FIG. 7, the trap apparatus 30 comprises a trap unit 34 having a spiral baffle plate 32 for forming a spiral fluid passage, a trap container 36 for housing the trap unit 34, an inlet pipe 38 connected to the upper end of the trap container 36, and an outlet pipe 40 connected to the bottom of the trap container 36. The trap apparatus 30 is connected to the evacuation passage 16 by quick couplings 42a and 42b. The trap apparatus 30 has a cooling medium flow passage 44, at the central part thereof, through which a cooling medium cooled to a temperature lower than the condensing temperature of the components, to be trapped, having a low vapor pressure flows. Thus, the components having a low vapor pressure in the discharged gases which have entered the trap container 36 through the inlet pipe 38 are trapped and removed by the trap unit 34 while the discharged gases flow along the baffle plate 32, and hence only the components having a high vapor pressure are led to the vacuum pump 18 through the outlet pipe 40 and the evacuation passage 16 (see FIG. 6).

However, in this trap apparatus, the components having a low vapor pressure such as the unconsumed material are condensed to become powdery substances in the trap container, and the produced powdery substances are gradually deposited on the surface of the trap unit. These deposited solid substances, if counterflow occurs, or the supply amount from the upstream side is abruptly decreased or is stopped under change of conditions in the evacuation system, form particles which will flow into the reaction chamber and deposit on the substrate, resulting in deteriorating quality of a produced film.

SUMMARY OF THE INVENTION

It is therefore an object of the present invention to provide a trap apparatus which can reliably trap components having a low vapor pressure in gases discharged from a processing apparatus such as a chemical vapor deposition apparatus and prevent the trapped components from being scattered around.

According to a first aspect of the present invention, there is provided a trap apparatus disposed downstream of a vacuum process chamber. The vacuum process chamber is for processing a substrate. The trap apparatus is for trapping a component having a low vapor pressure contained in a gas discharged from the vacuum process chamber. The trap apparatus comprises a trap container for introducing the gas discharged from the vacuum process chamber, and a cooling device provided in the trap container for cooling the gas to a temperature equal to or lower than a condensing temperature of a gas component which is contained in the gas and easily liquidized.

According to the present invention, the discharged gas introduced into the trap container is cooled by the cooling device, and a gas such as a solvent gas (gas generated from solvent by vaporization), which is contained in the material gas and easily liquidized, is condensed in the trap container, and thus the condensed substances are contained in deposited substances in the trap container. Therefore, the deposited substances in the trap container are moistened, and hence adhesion between the deposited substances and the inner surface of the trap container and cohesion of the deposited substances are heightened. Thus, the deposited substances are prevented from being removed from the inner surface of the trap container and the like, thus preventing generation of particles.

According to a second aspect of the present invention, there is provided a trap apparatus disposed downstream of a vacuum process chamber. The vacuum process chamber is for processing a substrate. The trap apparatus is for trapping a component having a low vapor pressure contained in a gas discharged from the vacuum process chamber. The trap apparatus comprises a trap container for introducing the gas discharged from the vacuum process chamber, and a solvent supply device for supplying a solvent, which is hard to be volatilized, into the trap container.

According to the present invention, by supplying the solvent to the deposited substances in the trap container, the deposited substances in the trap container are moistened, and hence adhesion between the deposited substances and the inner surface of the trap container and cohesion of the deposited substances are heightened. Thus, the deposited substances are prevented from being removed from the inner surface of the trap container and the like, thus preventing generation of particles. As the solvent which is hard to be volatilized, such material as to be liquid under vacuum in the trap container and as to keep a desired degree of vacuum in the processing chamber is selected. By spraying the solvent or scattering the solvent in the trap container, absorption reaction between gas and liquid may be accelerated.

According to a third aspect of the present invention, there is provided a trap apparatus wherein the solvent which is hard to be volatilized is selected from a solvent which is used as a solvent of material including butyl acetate, tetrahydrofrane, or lutidine, a solvent which is used as adduct of material including tetraglymes, toluenes, or tetraenes, or a solvent which is used as a ligand of material including dipivaloylmethane.

According to the present invention, a component having a low vapor pressure in the discharged gas introduced into the trap container is trapped in the liquid solvent stored in the solvent storage, and hence scattering of the trapped substances can be prevented.

In a preferred aspect, the solvent which is hard to be volatilized is selected from a solvent which is used as a solvent of material including butyl acetate, tetrahydrofrane, or lutidine, a solvent which is used as adduct of material including tetraglymes, toluenes, or tetraenes, or a solvent which is used as a ligand of material including dipivaloylmethane. Thus, even if the solvent flows back to the reaction chamber, it does not affect adversely quality of the deposited film.

According to a fourth aspect of the present invention, there is provided a thin-film vapor deposition apparatus comprising: a vaporizer for vaporizing a liquid material; a reaction chamber disposed downstream of the vaporizer; a vacuum pump disposed downstream of the reaction chamber; and a trap apparatus provided in an evacuation passage extending from the reaction chamber to the vacuum chamber, the trap apparatus comprising: a trap container for introducing the gas discharged from the vacuum process chamber; and a cooling device provided in the trap container for cooling the gas to a temperature equal to or lower than a condensing temperature of a gas component which is contained in the gas and easily liquidized.

According to another aspect of the present invention, there is provided a thin-film vapor deposition apparatus comprising: a vaporizer for vaporizing a liquid material; a reaction chamber disposed downstream of the vaporizer; a vacuum pump disposed downstream of the reaction chamber; and a trap apparatus provided in an evacuation passage extending from the reaction chamber to the vacuum chamber, the trap apparatus comprising: a trap container for introducing the gas discharged from the vacuum process chamber; and a solvent supply device for supplying a solvent, which is hard to be volatilized, into the trap container.

According to still another aspect of the present invention, there is provided a thin-film vapor deposition apparatus comprising: a vaporizer for vaporizing a liquid material; a reaction chamber disposed downstream of the vaporizer; a vacuum pump disposed downstream of the reaction chamber; and a trap apparatus provided in an evacuation passage extending from the reaction chamber to the vacuum chamber, the trap apparatus comprising: a trap container for introducing the gas discharged from the vacuum process chamber; and a solvent storage provided in the trap container for storing a solvent, which is hard to be volatilized, in a liquid condition.

The above and other objects, features, and advantages of the present invention will become apparent from the following description when taken in conjunction with the accompanying drawings which illustrates preferred embodiments of the present invention by way of example.

DETAILED DESCRIPTION OF THE PREFERRED EMBODIMENTS

Figure 6:
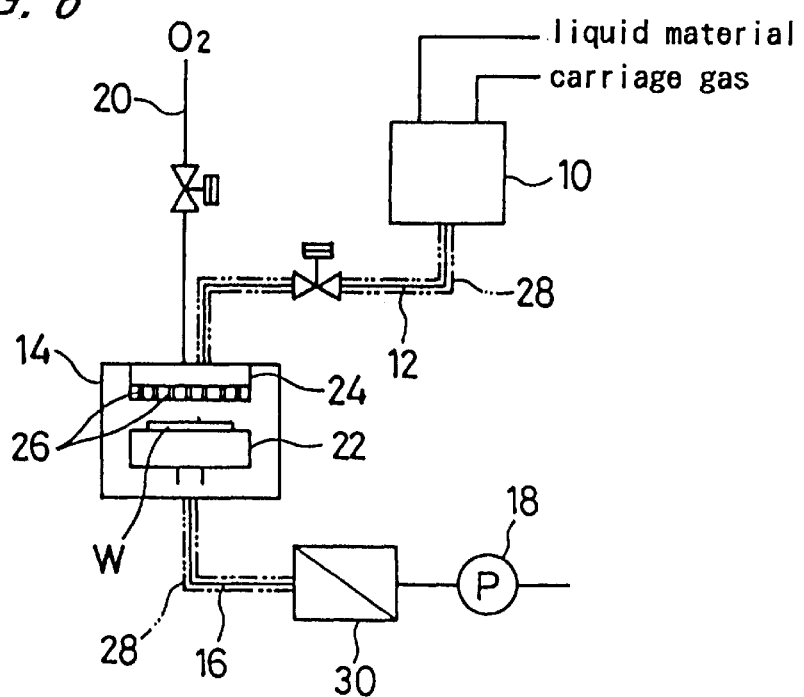
FIG. 6 is a schematic diagram of a thin-film vapor deposition apparatus to which the present invention is applied.
Figure 7:
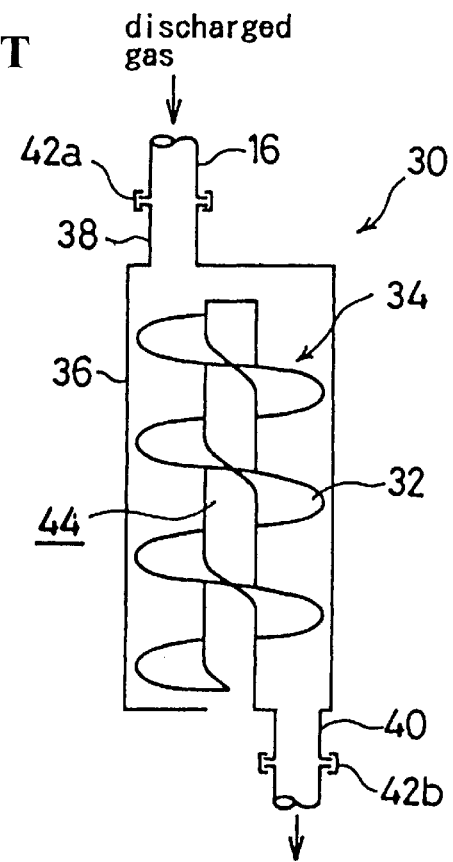
FIG. 7 is a schematic view of a conventional trap apparatus.

Next, a trap apparatus according to the present invention will be described below with reference to the drawings. The trap apparatus according to the present invention is applied to the thin-film vapor deposition apparatus shown in FIG. 6, and will be described with reference to FIGS. 1 through 3. The components or elements shown in FIGS. 1 through 3 which are identical or similar to the components or elements in the conventional apparatus shown in FIG. 7 are designated using the same reference numerals.

Figure 1:
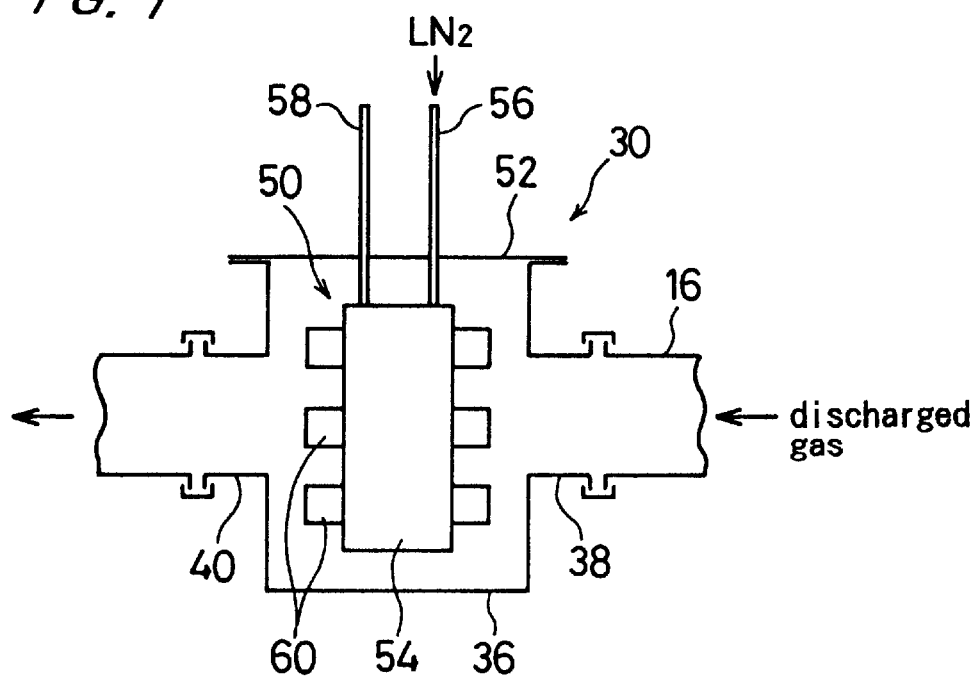
FIG. 1 is a schematic view of a trap apparatus according to a first embodiment of the present invention.

FIG. 1 shows a trap apparatus according to a first embodiment of the present invention. The trap apparatus 30 in this embodiment comprises a trap container 36 having a cylindrical cup-shaped body for defining a trap chamber therein, an inlet pipe 38 connected to the side surface of the trap container 36, and an outlet pipe 40 connected to the other side surface of the trap container 36. A cooling device 50 is disposed in the trap container 36 to cool an interior atmosphere of the trap container 36, and the upper open end of the trap container 36 is closed by a lid 52. The cooling device 50 serves not only to solidify components having a low vapor pressure such as unreacted material gas but also to cool components which are relatively easily liquidized to a temperature so as to be condensed or lower.

The cooling device 50 uses liquid nitrogen in this embodiment, and has a vessel 54 for storing liquid nitrogen, a liquid nitrogen supply pipe 56 for supplying liquid nitrogen into the vessel 54, and a discharge pipe 58. The vessel 54 has a number of fins 60 on the outer surface thereof. In the cooling device 50, the fins 60 are cooled to a temperature of approximately −176° C. corresponding to a boiling point of liquid nitrogen. As shown in FIG. 6, the trap apparatus 30 is provided in the evacuation passage 16 which interconnects the reaction chamber 14 and the vacuum pump 18, and gases discharged from the reaction chamber 14 are introduced into the trap container 36.

Next, the operation of the trap apparatus having the above structure will be described below.

The material gas supplied to the vapor deposition apparatus is produced by liquidizing $Ba(DPM)_2$, $Sr(DPM)_2$ or the like which is solid at room temperature, adding an adduct for accelerating vaporization, mixing the liquidized substance with organic solvent, and vaporizing the obtained mixture. Therefore, gases discharged from the reaction chamber 14 contain components having a low vapor pressure such as unconsumed material or reaction by-product, a solvent gas contained in the material gas, an adduct gas of material, and a carriage gas. As a solvent, butyl acetate, tetrahydrofuran, lutidine, or the like is used, and as an adduct, tetraglymes, toluenes, tetraenes, or the like is used.

The discharged gases containing various substances are introduced into the trap container 36, and the components having a low vapor pressure such as the unconsumed material or the reaction by-product are solidified and deposited on the inner surface of the trap container 36 and the outer surfaces of the fins 60 of the cooling device 50. At the same time, gas components such as a solvent or an adduct which are easily liquidized are condensed, and hence they are also contained in the deposited substances. Thus, the deposited substances in the trap container 36 become moist. Therefore, adhesion between the deposited substances and the inner surface of the trap container and cohesion of the deposited substances are heightened, and hence the deposited substances are prevented from being removed from the inner surface of the trap container 36 and the surfaces of the fins 60, thus preventing generation of particles.

Figure 2:
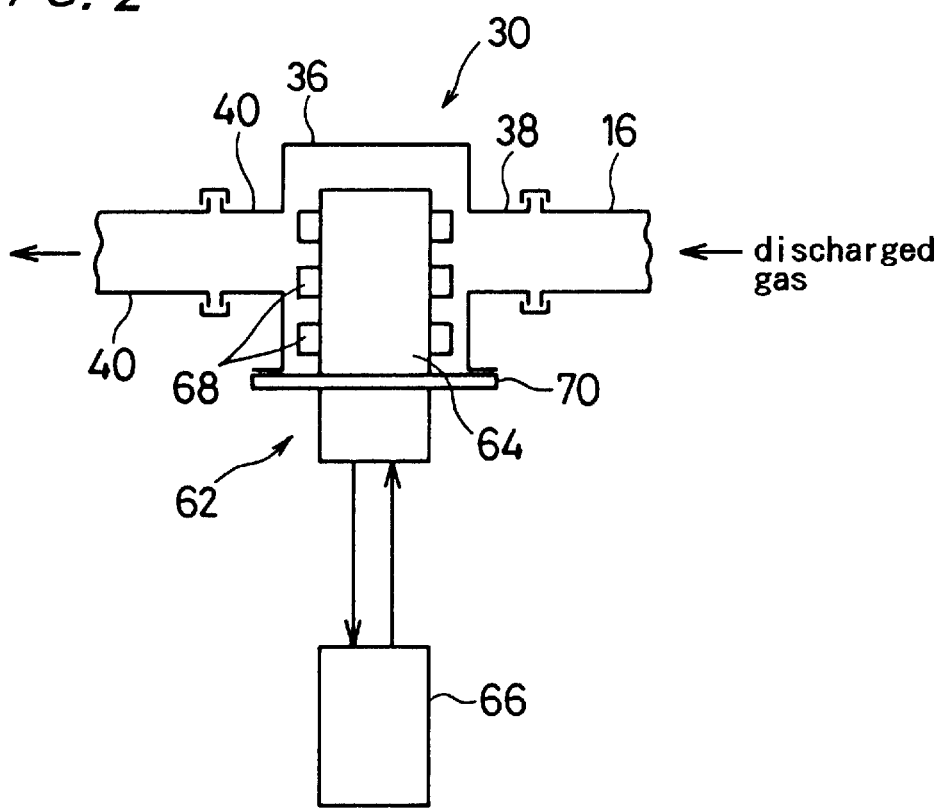
FIG. 2 is a schematic view of a trap apparatus according to a second embodiment of the present invention.

FIG. 2 shows a trap apparatus according to a second embodiment of the present invention. The trap apparatus in the second embodiment is different from the trap apparatus in the first embodiment in that the cooling device 50 using liquid nitrogen is replaced with a GM (Gifford-McMahon) cycle helium refrigerator 62. The GM cycle helium refrigerator 62 has such a structure that cold panels 68 provided in a refrigerating unit 64 are cooled by supplying liquid helium from the compressor 66 to the refrigerating unit 64. The open end of the trap container 36 is closed by a flange 70 of the refrigerating unit 64.

Since the cold panels 68 are cooled to a temperature of approximately −150° C. in the GM cycle helium refrigerator 62, the interior atmosphere in the trap container 36 can be cooled to a temperature equal to or lower than the condensing temperature of the solvent gas contained in the material gas or the adduct gas of material.

Figure 3:
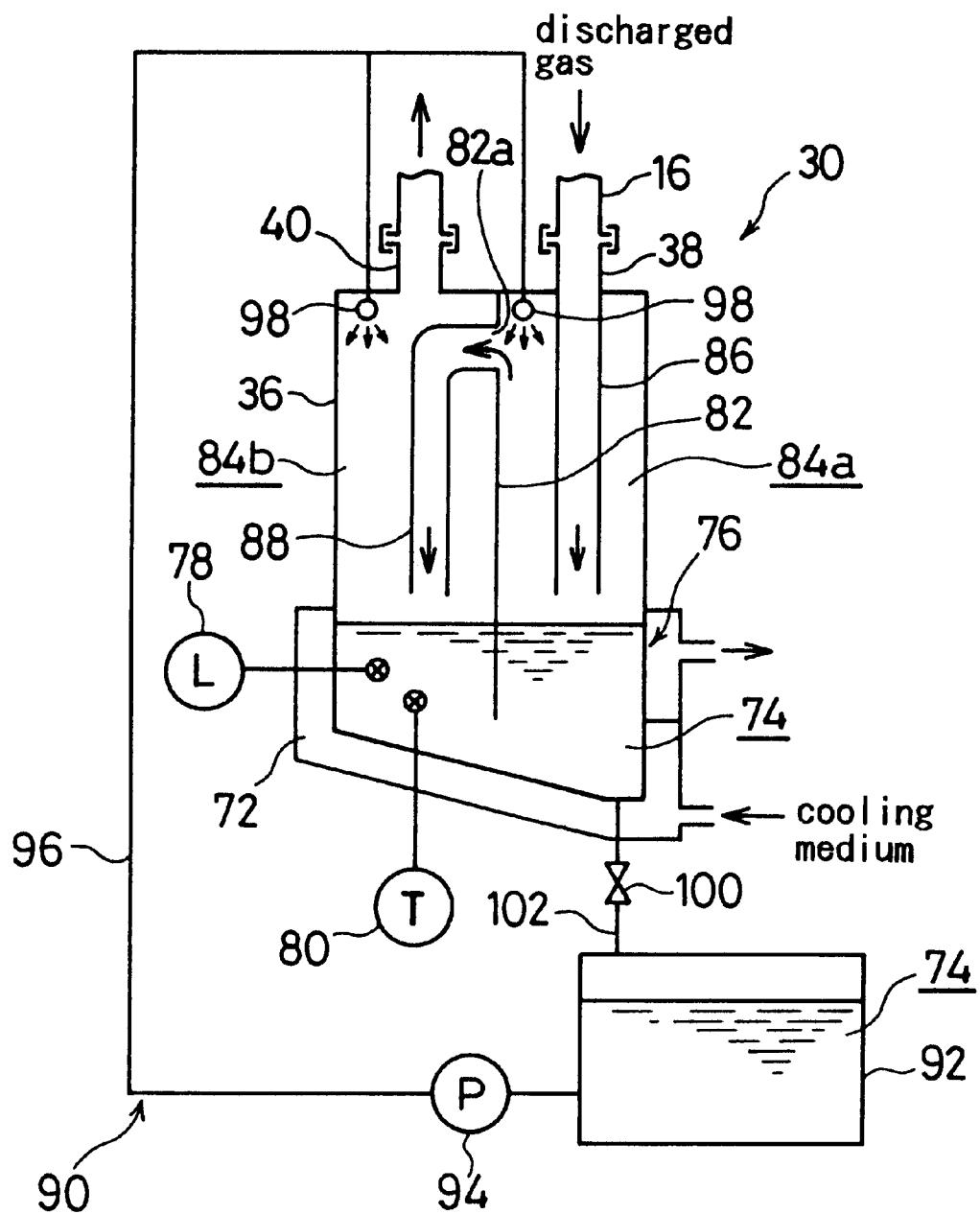
FIG. 3 is a schematic view of a trap apparatus according to a third embodiment of the present invention.

FIG. 3 shows a trap apparatus according to a third embodiment of the present invention. The trap apparatus in the third embodiment has a two-stage trap structure. This structure is applicable to the case where material itself has a low vapor pressure and can be trapped by natural heat dissipation. In this embodiment, the trap container 36 in the trap apparatus 30 has a solvent storage 76 disposed at a lower portion thereof for storing a solvent 74, which is hard to be volatilized, in a liquid state. The solvent storage 76 is enclosed by a cooling jacket 72 through which cooling medium flows. In the solvent storage 76, there are provided a liquid level sensor 78 for detecting a liquid level of the solvent 74, and a temperature sensor 80 for detecting a temperature of the solvent 74.

The solvent 74 may use a solvent such as butyl acetate which is used as a solvent of material, a solvent such as tetraglymes which is used as an adduct of material, or a solvent such as dipivaloylmethane which is used as a ligand of material.

The interior of the trap container 36 is divided by a partition plate 82 having a lower end extending to a position lower than the liquid level of the solvent 74. The partition plate 82 divides the trap container 36 into a first chamber 84a and a second chamber 84b. An inlet pipe 38 is connected to the upper end of the first chamber 84a and an outlet pipe 40 is connected to the upper end of the second chamber 84b. The inlet pipe 38 has a lower end connected to an inner pipe 86 which extends downwardly in the first chamber 84a. The partition plate 82 has a communication opening 82a, at an upper portion thereof, where a communication pipe 88 extending downwardly in the second chamber 84b is connected to the partition plate 82. Thus, there is provided a discharge gas passage in which the discharged gases flow downwardly in the inlet pipe 38 and the inner pipe 86, flow upwardly in the first chamber 84a, and flow downwardly in the communication pipe 88, and then flow upwardly again and are discharged from the outlet pipe 40.

The trap apparatus 30 includes a solvent supply device 90 for supplying the solvent 74 into the trap container 36 periodically or irregularly. The solvent supply device 90 comprises a solvent tank 92 for storing the solvent 74, and a solvent supply line 96 extending from the solvent tank 92 and having a solvent supply pump 94 thereon. The solvent supply line 96 is branched into a line extending to the first chamber 84a and a line extending to the second chamber 84b, and both of the lines are connected to respective sprayers 98 located in the first chamber 84a and the second chamber 84b, respectively. The solvent tank 92 is connected to the solvent storage 76 in the trap container 36 through a recovery line 102 having a valve 100 thereon. Thus, by operating the solvent supply pump 94, the solvent 74 stored in the solvent tank 92 is supplied from the sprayers 98 into the first chamber 84a and the second chamber 84b in the trap container 36.

In the trap apparatus of this embodiment, gases discharged from the reaction chamber 14 are introduced into the first chamber 84a in the trap container 36 through the inlet pipe 38, and flow upwardly in the first chamber 84a. During this upward flow, components having a low vapor pressure such as unconsumed material are cooled by natural heat dissipation and condensed, and fall due to inertia of the flow, and are then trapped by the solvent 74 stored in the solvent storage 76. The gases which have flowed upwardly in the first chamber 84a flow downwardly in the communication pipe 88, and then are introduced into the second chamber 84b. In the second chamber 84b, during the upward flow, components having a low vapor pressure such as unconsumed material are cooled by natural heat dissipation and trapped by the solvent 74 stored in the solvent storage 76. The temperature of the solvent 74 in the solvent storage 76 is controlled to a value so as not to progress vaporization of components having a low vapor pressure.

The components having a low vapor pressure solidified in the first chamber 84a and the second chamber 84b are deposited partly on the inner surface of the trap container 36, and the surfaces of partition plate 82, the inner pipe 86 and the communication pipe 88. Therefore, the solvent supply pump 94 of the solvent supply device 90 is operated periodically or irregularly, and the solvent 74 stored in the solvent tank 92 is sprayed from the sprayers 98 into the first chamber 84a and the second chamber 84b. Thus, the components having a low vapor pressure and deposited on the inner surface of the trap container 36, the surface of the partition plate 82 and the like are moistened by the solvent 74, and hence adhesion between the deposited substances and the inner surface of the container and the like and cohesion of the deposited substances are heightened, and the deposited substances are prevented from being removed from the inner surface of the trap container 36, the surface of the partition plate 82 and the like.

At this time, the liquid level of the solvent 74 in the solvent storage 76 can be adjusted by adjusting the amount of the solvent 74 supplied from the sprayers 98 and the amount of the solvent 74 discharged from the solvent storage 76. Further, if the concentration of material in the solvent 74 stored in the solvent storage 76 becomes high, then the solvent 74 in the solvent storage 76 is replaced with a new one, and trapping operation can be continued.

As the solvent 74, in the case where a solvent such as butyl acetate which is used as a solvent of material, a solvent such as dipivaloylmethane which is used as a ligand of material, or a solvent such as tetraglymes which is used as an adduct of material is utilized, even if the solvent 74 is vaporized and flows back into the reaction chamber 14, the solvent is prevented from being contained in the thin film deposited on the substrate, thus preventing detrioration of quality of the film.

Figure 4:
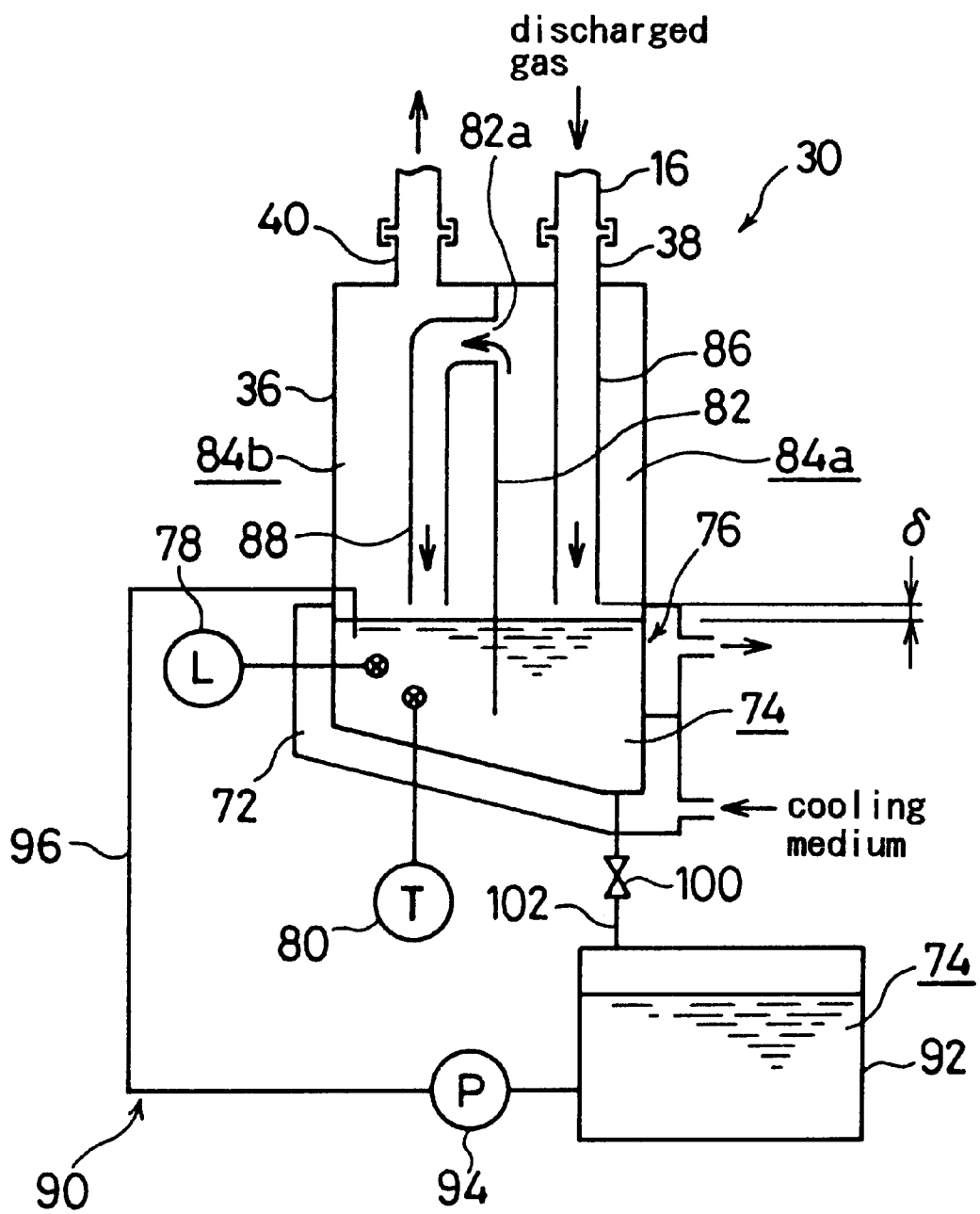
FIG. 4 is a schematic view of a trap apparatus according to a fourth embodiment of the present invention.

FIG. 4 shows a modified version of the third embodiment shown in. FIG. 3. The solvent 74, which is hard to be volatilized, is supplied directly to the solvent storage 76 without passing through the sprayers 98. In this embodiment, the solvent supply pump 94 is controlled by a controller (not shown) so that the liquid level of the solvent 74 is kept to form a clearance δ having a certain small value between the liquid level, and the inner pipe 86 and the communication pipe 88. This structure allows the discharged gases to collide with solvent 74, and the components having a low vapor pressure in the gases are trapped directly by the solvent 74. According to the trap apparatus of this embodiment, it is difficult for scattering of the deposited substances to occur, compared with the conventional trap apparatus incorporating the baffle plate 32 shown in FIG. 7.

Figure 5:
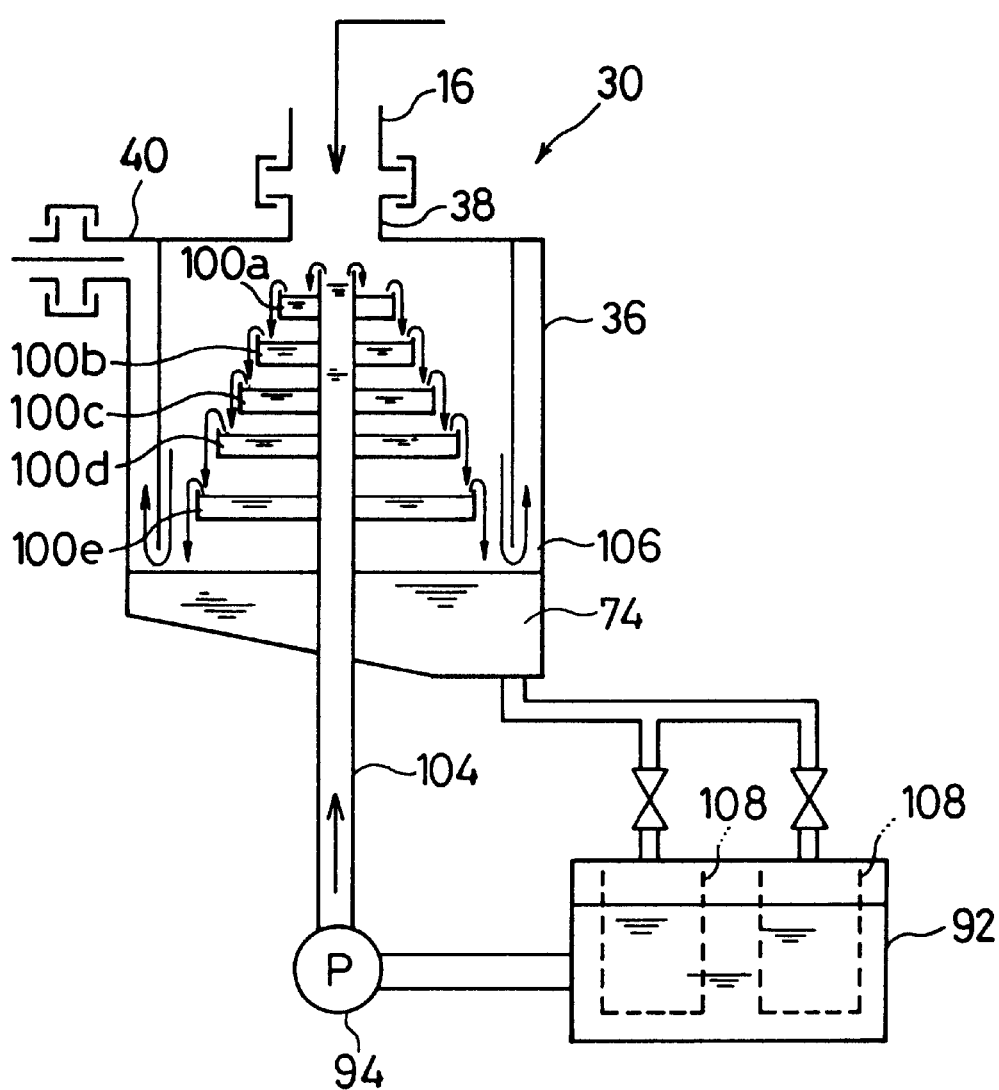
FIG. 5 is a schematic view of a trap apparatus according to a fifth embodiment of the present invention.

FIG. 5 shows a trap apparatus according to still another embodiment of the present invention. In this embodiment, a plurality of trays 100a, 100b, 100c, 100d and 100e whose diameters are gradually larger downwardly are provided in a multi-stage manner. The solvent 74, which is hard to be vaporized, is supplied to the uppermost tray 100a from a storage tank 92 by a pump 94 through a supply pipe 104 extending upwardly at a central portion of the container 36, and then supplied to the lower trays 100b to 100e in sequence in order of height by overflow, thus constructing multi-stage cascades. The discharged gases are introduced into the container 36 through the inlet pipe 38 provided at the central and upper portion of the trap container, pass through a discharge opening 106 positioned at the outer circumferential portion of the trap container 36 and immediately above the liquid level of the solvent 74, and are then discharged from the trap container 36 through the outlet pipe 40. The solvent 74, which is hard to be vaporized, is circulated between the interior of the trap container 36 and the external storage tank 92, and purified by filters 108 and reused.

According to this embodiment, liquid levels and cascades are provided in a multi-stage manner to increase trap efficiency, and the trapped substances are removed with the filter 108 by circulating the solvent 74 and discharged to the exterior of the system. The timing of replacement of the filter 108 may be judged by detecting a rise of the liquid level of the solvent in the trap apparatus 30 for thereby estimating resistance of the filter.

As described above, according to the present invention, gases, which are easily liquidized, such as a solvent gas contained in a material gas are condensed in the trap container, or substances which are hard to be volatilized are supplied to the trap container, and deposited substances in the trap container are moistened, and hence adhesion between the deposited substances and the inner surface of the trap container and cohesion of the deposited substances are heightened. Thus, the deposited substances are prevented from being removed from the inner surface of the trap container and the like, thus preventing generation of particles. Therefore, components having a low vapor pressure in the discharge gases can be trapped reliably and scattering of the trapped substances can be prevented. As a result, in a process chamber such as a reaction chamber positioned at the preceding stage, a process such as deposition can be carried out smoothly and in a high quality, and hence the present invention offers a useful technology in the semiconductor manufacturing industry.

Although certain preferred embodiments of the present invention have been shown and described in detail, it should be understood that various changes and modifications may be made therein without departing from the scope of the appended claims.

What is claimed is:

1. A trap apparatus for use with a vacuum process chamber for processing a substrate, said trap apparatus to be disposed downstream of the vacuum process chamber and being operable to trap a component having a low vapor pressure contained in a gas discharged from the vacuum process chamber, said trap apparatus comprising:

a trap container for receiving the gas discharged from the vacuum process chamber;

a solvent supply device for supplying a solvent into said trap container, wherein the solvent traps the component having the low vapor pressure; and a solvent cooling device for cooling the solvent to condense the component having the low vapor pressure.

2. A trap apparatus according to claim 1, wherein the solvent is butyl acetate, tetrahydrofuran, lutidine, traglymes, toluenes, tetraenes, or dipivaloylmethane.

3. A trap apparatus for use with a vacuum process chamber for processing a substrate, said trap apparatus to be disposed downstream of the vacuum process chamber and being operable to trap a component having a low vapor pressure contained in a gas discharged from the vacuum process chamber, said trap apparatus comprising:

a trap container, having a first chamber and a second chamber, for receiving the gas discharged from the vacuum process chamber, said trap container having a vacuum therein;

a solvent storage, provided in said trap container connecting said first and second chamber of said trap container, for storing a solvent in a liquid condition, wherein the solvent is a material that tends to resist volatilization and remain a liquid under the vacuum in said trap container;

a first pipe for introducing the gas discharged from the vacuum process chamber into the first chamber of the trap container, said first pipe extending to a location near a liquid level of said solvent in said solvent storage to form a clearance between the liquid level of said solvent and a lower end of said first pipe; and a second pipe for introducing the gas discharged from the first chamber of the trap container into the second chamber of the trap container, said second pipe extending to a location near the liquid level of said solvent in said solvent storage to form a clearance between the liquid level of said solvent and a lower end of said second pipe;

wherein the gas discharged from said first pipe and said second pipe collides with said solvent and the component having the lower vapor pressure in the gas is trapped directly by said solvent.

4. A trap apparatus according to claim 3, wherein the solvent is butyl acetate, tetrahydrofuran, lutidine, traglymes, toluenes, tetraenes, or dipivaloylmethane.

5. A thin-film vapor deposition apparatus comprising:

a vaporizer for vaporizing a liquid material;

a reaction chamber disposed downstream of said vaporizer;

a vacuum pump disposed downstream of said reaction chamber;

an evacuation passage extending from said reaction chamber to said vacuum pump; and a trap apparatus provided in said evacuation passage, said trap apparatus comprising:

a trap container for receiving a gas discharged from the reaction chamber, a solvent supply device for supplying a solvent into said trap container, wherein the solvent traps a component having a low vapor pressure in the gas; and a solvent cooling device for cooling the solvent.

6. A trap apparatus according to claim 5, wherein the solvent is butyl acetate, tetrahydrofuran, lutidine, traglymes, toluenes, tetraenes, or dipivaloylmethane.

7. A thin-film vapor deposition apparatus comprising:

a vaporizer for vaporizing a liquid material;

a reaction chamber disposed down stream of said vaporizer;

a vacuum pump disposed downstream of said reaction chamber;

an evacuation passage extending from said reaction chamber to said vacuum pump; and a trap apparatus provided in said evacuation passage, said trap apparatus comprising:

a trap container, having a first chamber and a second chamber, for receiving a gas discharged from the reaction chamber, said trap container having a vacuum therein;

a solvent storage, provided in said trap container connecting said first and second chambers of said trap container, for storing a solvent in a liquid condition, wherein the solvent is a material that tends to resist volatilization and remain a liquid under the vacuum in said trap container;

a first pipe for introducing the gas discharged from the reaction chamber into the first chamber of the trap container, said first pipe extending to a location near a liquid level of said solvent in said solvent storage to form a clearance between the liquid level of said solvent and a lower end of said first pipe; and a second pipe for introducing the gas discharged from the first chamber of the trap container into the second chamber of the trap container, said second pipe extending to a location near the liquid level of said solvent in said solvent storage to form a clearance between the liquid level of said solvent and a lower end of said second pipe;

wherein the gas discharged from said first pipe and said second pipe collides with said solvent and a component having a lower vapor pressure in the gas is trapped directly by said solvent.

8. A trap apparatus according to claim 7, wherein the solvent is butyl acetate, tetrahydrofuran, lutidine, traglymes, toluenes, tetraenes, or dipivaloylmethane.

* * * * *